US007141919B1

(12) United States Patent
Hamada et al.

(10) Patent No.: US 7,141,919 B1
(45) Date of Patent: Nov. 28, 2006

(54) PIEZOELECTRIC ELECTROACOUSTIC TRANSDUCER

(75) Inventors: Kazuaki Hamada, Toyama-ken (JP); Tetsuo Takeshima, Toyama (JP); Manabu Sumita, Toyama (JP); Keiichi Kami, Toyama (JP); Mitsunori Ishimasa, Toyama (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 582 days.

(21) Appl. No.: 10/435,550

(22) Filed: May 12, 2003

(30) Foreign Application Priority Data

Jun. 12, 2002 (JP) ............................ 2002-170760

(51) Int. Cl.
*H04R 17/00* (2006.01)
*H01L 41/04* (2006.01)

(52) U.S. Cl. ....................... 310/348; 381/190; 310/324

(58) Field of Classification Search ........ 310/344–346, 310/348, 324; 381/190
See application file for complete search history.

(56) References Cited

U.S. PATENT DOCUMENTS 4,520,413 A * 5/1985 Piotrowski et al. ......... 360/328
6,420,818 B1 * 7/2002 Kishimoto et al. ......... 310/324
6,445,108 B1 * 9/2002 Takeshima et al. ......... 310/322
6,472,797 B1 * 10/2002 Kishimoto .................. 310/324
6,472,798 B1 * 10/2002 Kishimoto .................. 310/344
6,570,299 B1 * 5/2003 Takeshima et al. ......... 310/348
6,741,710 B1 5/2004 Takeshima et al. ......... 381/190
6,894,423 B1 * 5/2005 Takeshima et al. ......... 310/324
6,969,942 B1 * 11/2005 Takeshima et al. ......... 310/324
2001/0004180 A1 * 6/2001 Kishimoto .................. 310/324
2001/0045792 A1 * 11/2001 Takeshima .................. 310/340
2003/0021458 A1 * 1/2003 Hamada et al. ............. 382/135
2003/0107300 A1 * 6/2003 Nakamura et al. .......... 310/324
2003/0202672 A1 * 10/2003 Yamauchi et al. .......... 381/190
2004/0085001 A1 * 5/2004 Takeshima .................. 310/331
2004/0113215 A1 * 6/2004 Shimada et al. ............ 257/414
2004/0124748 A1 * 7/2004 Takeshima et al. ......... 310/331
2004/0195941 A1 * 10/2004 Ishimasa et al. ............ 310/348
2004/0201326 A1 * 10/2004 Yokoi et al. ................ 310/348
2004/0205949 A1 * 10/2004 Takeshima et al. ........ 29/25.35

(Continued)

FOREIGN PATENT DOCUMENTS

DE 100 07 455 A1 9/2000

(Continued)

OTHER PUBLICATIONS

Official Communication issued on Sep. 19, 2005 in the corresponding German Application No. 103 25 091.3-35. (With full English translation).

(Continued)

*Primary Examiner*—Darren Schuberg
*Assistant Examiner*—J. Aguirrechea
(74) *Attorney, Agent, or Firm*—Keating & Bennett, LLP

(57) ABSTRACT

A piezoelectric electroacoustic transducer includes a piezoelectric sounding body in which bending vibration is generated by applying an alternating signal between two electrodes, a case housing the piezoelectric sounding body, and a pair of terminals insert-molded in the case. In the piezoelectric electroacoustic transducer, internal connection portions of the pair of terminals are exposed on the inside surface of the side wall portion of the case so as to extend in a direction that is substantially perpendicular relative to the piezoelectric sounding body, and the internal connection portions of the terminals are electrically connected to the electrodes of the piezoelectric sounding body by using conductive adhesive. The internal connection portions of the terminals do not largely extend inside the case and accordingly, the dimensional difference between the case and the piezoelectric sounding body is minimized.

20 Claims, 9 Drawing Sheets

U.S. PATENT DOCUMENTS

| | | | | |
|---|---|---|---|---|
| 2004/0218769 | A1* | 11/2004 | Kami et al. | 381/189 |

FOREIGN PATENT DOCUMENTS

| | | |
|---|---|---|
| DE | 100 42 185 A1 | 1/2002 |
| JP | 2000-310990 | 11/2000 |
| JP | 2001-095094 | 4/2001 |
| JP | 2003-009286 | 1/2003 |

OTHER PUBLICATIONS

Official Communication issued in the corresponding Japanese Application No. 2002-170760, mailed on Jul. 4, 2006.

* cited by examiner

PIEZOELECTRIC ELECTROACOUSTIC TRANSDUCER

BACKGROUND OF THE INVENTION

1. Field of the Invention

The present invention relates to a piezoelectric electroacoustic transducer such as a piezoelectric sounder, piezoelectric speaker, piezoelectric receiver, or other such apparatus.

2. Description of the Related Art

Recently, in electronic equipment, home appliances, portable telephones, and other such apparatuses, a piezoelectric sounder, and piezoelectric speaker generating an alarm and operational cue signal have been widely used. In such piezoelectric electroacoustic transducers, a unimorph-type piezoelectric sounding body, in which a piezoelectric body made of a piezoelectric ceramic having electrodes disposed on the top and bottom surfaces is attached to one surface of a metal plate, is generally used. Furthermore, a piezoelectric electroacoustic transducer, in which a bimorph-type piezoelectric sounding body made of a piezoelectric ceramic of a laminated construction is used, has been proposed (see Japanese Unexamined Patent Application Publication No. 2001-95094).

FIG. 8 shows one example of a related piezoelectric electroacoustic transducer. The piezoelectric electroacoustic transducer includes a case 40, a cover 41, a piezoelectric sounding body 42, and terminals 43 and 44 which are insert-molded in the case 40. One end portion of the terminals 43 and 44 supporting both ends of the piezoelectric sounding body 42 is horizontally exposed at both ends of the inside of the case 40. The electrodes of the piezoelectric sounding body 42 are electrically connected to the terminals 43 and 44 by using a conductive adhesive 46, and the periphery portion of the piezoelectric sounding body 42 is fixed to the case 40 such that an elastic adhesive 47 of silicone rubber, etc., is coated over the electrodes. However, in this way, when the piezoelectric sounding body 42 is directly connected to the terminals 43 and 44 by using a conductive adhesive 46, both ends of the piezoelectric sounding body 42 are excessively restrained. As a result, the amount of displacement of the piezoelectric sounding body 42 is reduced which lowers the sound pressure.

Next, the applicant of the present invention has proposed a construction in which, as shown in FIG. 9, supporting portions 45 are provided at the inner portions of the case 40 inside the inserted terminals 43 and 44, the piezoelectric sounding body 42 is supported by the supporting portions 45, and the end surface of the piezoelectric sounding body 42 is covered by an elastic insulating material 48, and then a conductive adhesive is coated over the insulating material 48 between the piezoelectric sounding body 42 and the terminals 43 and 44. This device is disclosed in Japanese Patent Application No. 2001-193305 which was not published at the time of filing of this application. Moreover, after the conductive adhesive 46 has been coated, the periphery portion of the piezoelectric sounding body 42 is fixed to the case 40 by elastic adhesive (not illustrated). In this case, since both ends of the piezoelectric sounding body 42 are not excessively restrained by the case 40, the amount of displacement of the piezoelectric sounding body 42 increases and accordingly the sound pressure is increased.

A fixed length of the terminals 43 and 44 is required to be exposed inside the case 40 in order to ensure the conductivity to the conductive adhesive 46. However, when the supporting portions 45 for supporting the piezoelectric sounding body 42 are provided inside the terminals 43 and 44, the dimension S of the piezoelectric sounding body 42 is required to be reduced so as to be smaller by the exposed length of the terminals 43 and 44 than the dimension L of the case 40. In recent years, in keeping up with the demand for downsizing of electronic equipment, the miniaturization of piezoelectric electroacoustic transducers has also been required. Reducing the size of the case 40 means that the piezoelectric sounding body 42 is further reduced. When the dimension S of the piezoelectric sounding body 42 becomes smaller, the resonance frequency increases and the sound pressure is unfavorably reduced. Therefore, it is important that the dimensional difference between the dimension L of the case 40 and the dimension S of the piezoelectric sounding body 42 is kept as small as possible.

SUMMARY OF THE INVENTION

In order to overcome the problems described above, preferred embodiments of the present invention provide a piezoelectric electroacoustic transducer in which the dimensional difference between the case and the piezoelectric sounding body is minimized, the resonance frequency is lowered, and the sound pressure is increased.

According to a first preferred embodiment of the present invention, a piezoelectric electroacoustic transducer includes a piezoelectric sounding body in which, when an alternating signal is applied between two electrodes, bending vibration is generated, an enclosure for housing the piezoelectric sounding body, and a pair of terminals insert-molded in the enclosure. In the piezoelectric electroacoustic transducer, internal connection portions of the pair of terminals are exposed on the inside surface of the side wall of the enclosure so as to extend in a direction substantially perpendicular to the piezoelectric sounding body, and the internal connection portions of the terminals are electrically connected to electrodes of the piezoelectric sounding body.

Since the internal connection portions of the terminals are exposed on the inside surface of the side wall of the enclosure, the periphery portion of the piezoelectric sounding body can be positioned close to the side wall of the enclosure and accordingly, the dimensional difference between the case and the piezoelectric sounding body is minimized. Therefore, even if the outer dimension of the case is the same, the dimension of the piezoelectric sounding body can be increased compared with a related one, and, as a result, the resonance frequency of the piezoelectric sounding body is reduced and the sound pressure can be increased. Although the substantially perpendicularly exposed terminals are electrically connected to the electrodes of the piezoelectric sounding body by conductive adhesive, since the exposed length of the terminals are determined by the height of the side wall of the case, the contact area between the conductive adhesive and the exposed portions of the terminals can be assured and the reliability of the electrical conduction can be assured.

In a piezoelectric electroacoustic transducer of a preferred embodiment of the present invention, preferably the piezoelectric sounding body is substantially square-shaped, the pair of terminals are exposed on the inner surface of opposing two side walls of the enclosure, a supporting portion for supporting the four sides of the piezoelectric sounding body is provided inside the side wall of the enclosure, in the state where the piezoelectric sounding body is mounted on the supporting portions, the electrodes of the piezoelectric body are electrically connected to the internal connection portions by the conductive adhesive coated therebetween, and the periphery portion of the piezoelectric sounding body is fixed to the enclosure by the elastic adhesive coated therebetween. The substantially square-shaped piezoelectric sounding body shows a large amount of displacement compared with that of a round-shaped piezoelectric sounding body and has an excellent acoustic conversion efficiency. When such a substantially square-shaped piezoelectric sounding body is housed inside the enclosure, the periphery portion of the piezoelectric sounding body is mounted on the supporting portion provided inside the side wall of the enclosure and a conductive adhesive is coated from above, and accordingly both end portions of the piezoelectric sounding body are not tightly restrained and the amount of displacement of the piezoelectric sounding body can be increased. Furthermore, by coating an elastic adhesive between the periphery portion of the piezoelectric sounding body and the enclosure, the piezoelectric sounding body is fixed to the case and, at the same time, the gap between the piezoelectric sounding body and the case is sealed. Since the adhesive is elastic, the piezoelectric sounding body can be easily displaced.

In a piezoelectric electroacoustic transducer of a preferred embodiment of the present invention, the terminals are preferably substantially L-shaped in section, the upright portion of the terminals constitutes the internal connection portions, and portions extending along the bottom surface of the enclosure of the terminals constitute external connection portions. In this case, the terminals have a simple shape and no bending operation is required after the terminals have been insert-molded. In the case of U-shaped terminals in related products, after substantially flat terminals have been insert-molded, the portion extended outside the case has been bent along the case, but, in the case of substantially L-shaped terminals, such a bending operation is not necessary and there is no problem such as a warp due to the spring back of the terminals, or other defects or problems.

Other features, elements, characteristics and advantages of the present invention will become more apparent from the following detailed description of preferred embodiments thereof with reference to the attached drawings.

DETAILED DESCRIPTION OF PREFERRED EMBODIMENTS

FIGS. 1 to 4 show a piezoelectric sounder as one example of a piezoelectric electroacoustic transducer according to a preferred embodiment of the present invention. This piezoelectric sounder preferably includes a unimorph-type piezoelectric sounding body 1, a case 20, and a cover 30. The case 20 and the cover 30 constitute an enclosure.

Figure 1:
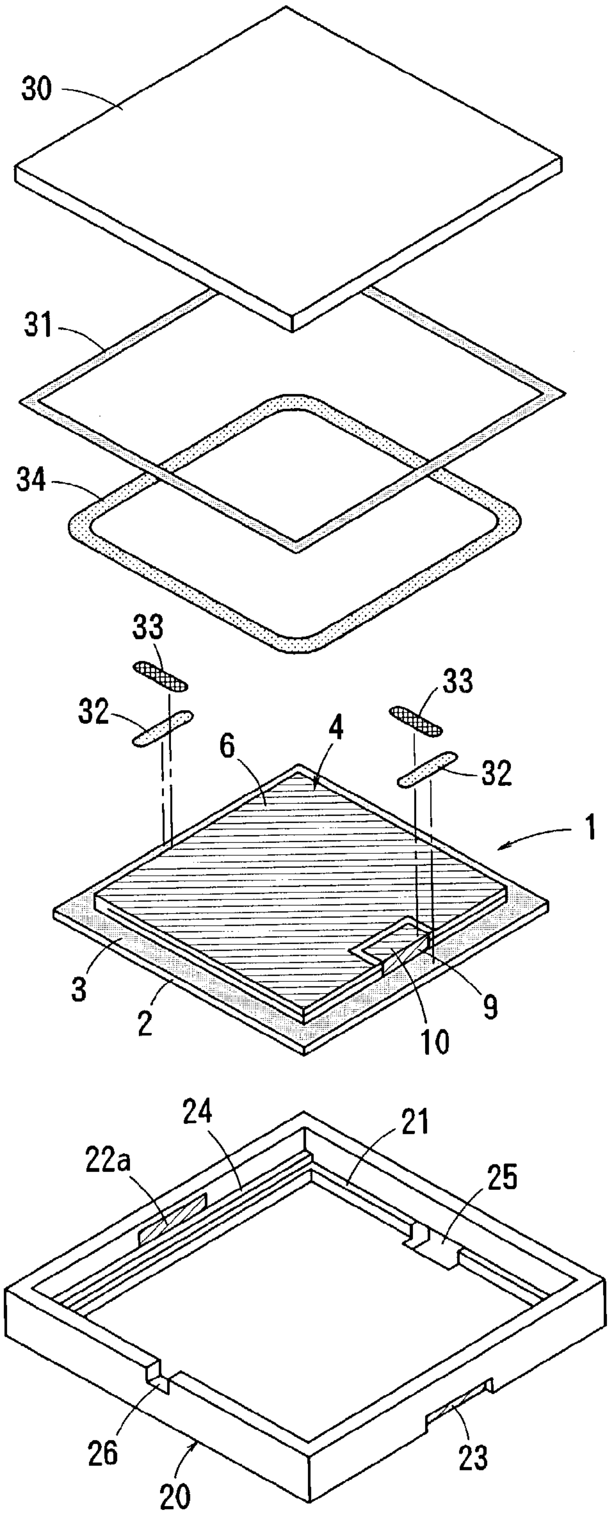
FIG. 1 is an exploded perspective view of one example of a piezoelectric electroacoustic transducer according to a preferred embodiment of the present invention.
Figure 2:
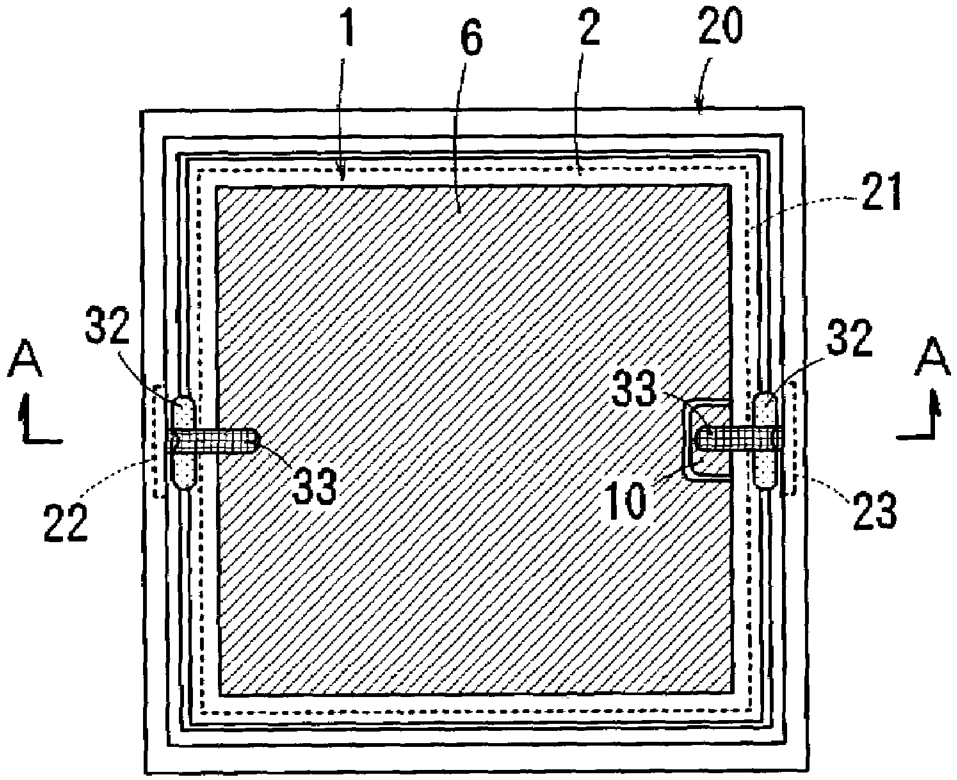
FIG. 2 is a top view of the piezoelectric electroacoustic transducer in FIG. 1, but with the cover and adhesive removed.
Figure 3:
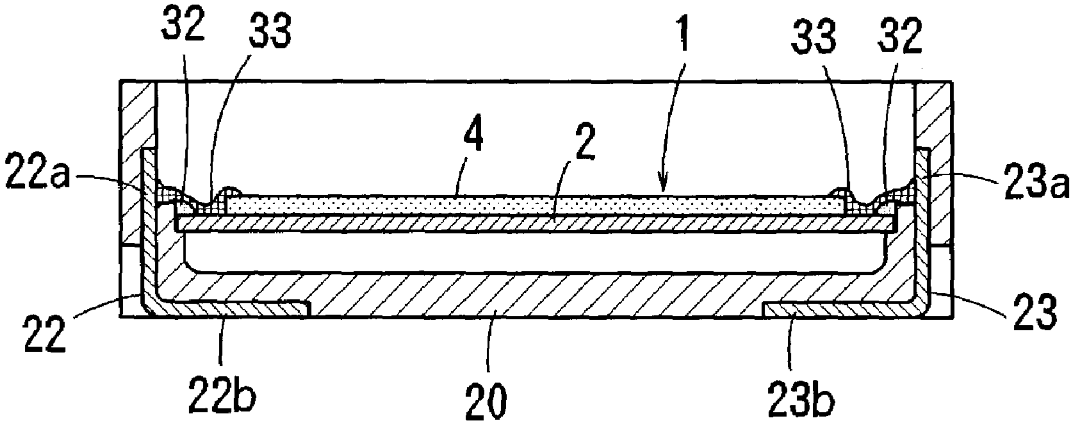
FIG. 3 is a sectional view taken on line A—A of FIG. 2.
Figure 4:
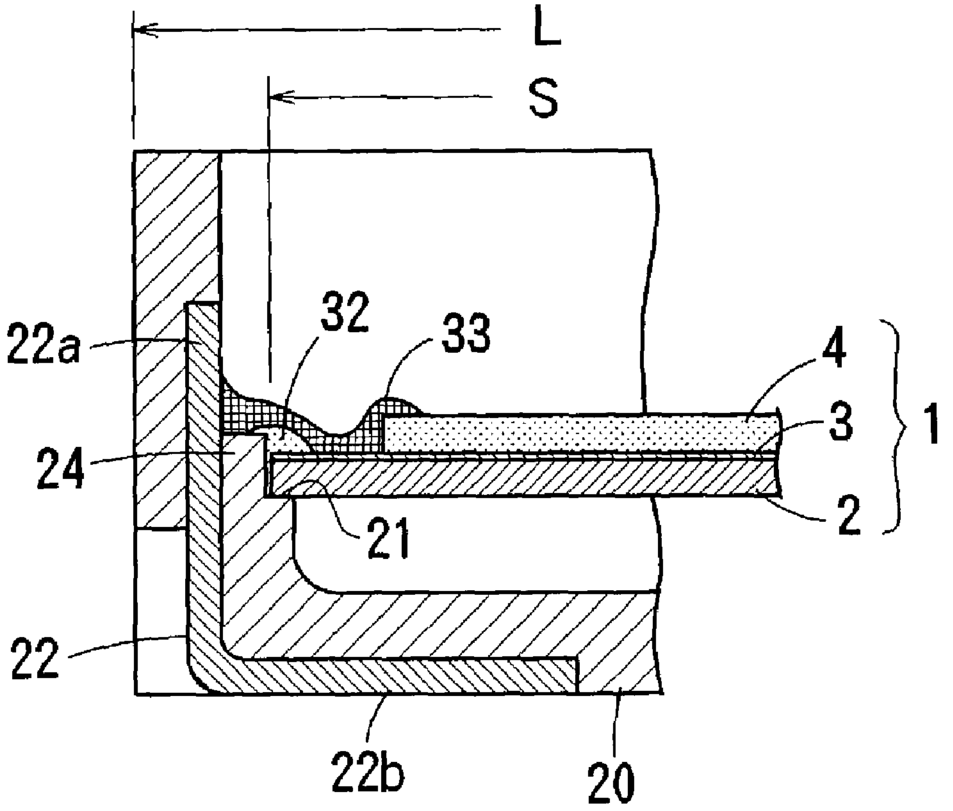
FIG. 4 is a partially enlarged view of FIG. 3.
Figure 5:
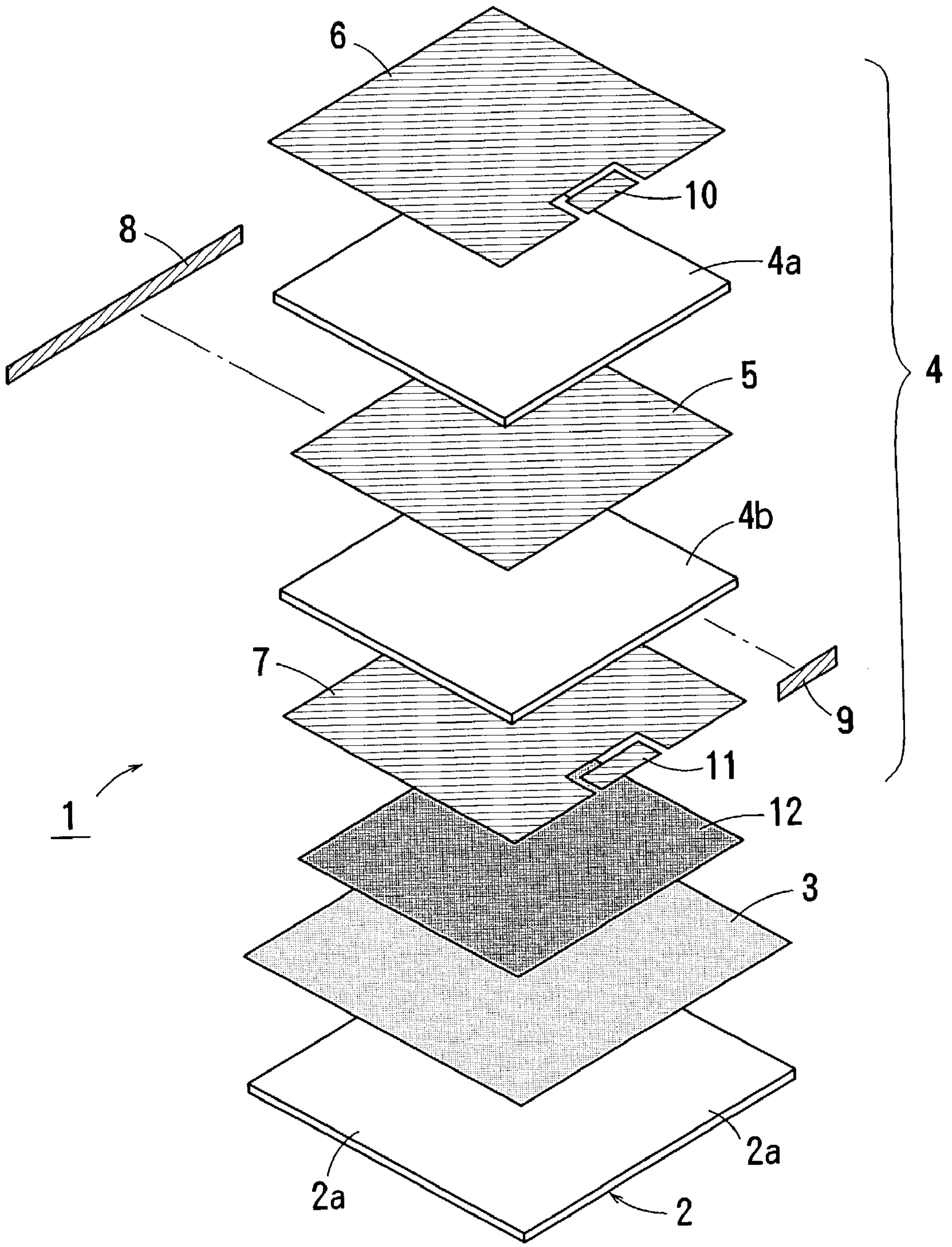
FIG. 5 is an exploded perspective view of a piezoelectric sounding body.
Figure 6:
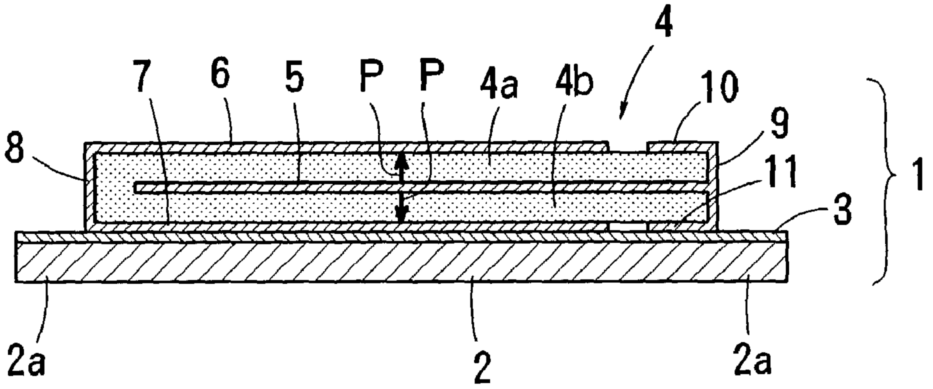
FIG. 6 is a sectional view of the piezoelectric sounding body in FIG. 5.

As shown in FIGS. 5 and 6, the piezoelectric sounding body 1 includes a substantially square metal plate 2, an insulating layer 3 disposed on the whole surface of the metal plate 2, and a substantially square piezoelectric body 4 fixed on the insulating layer 3 using adhesive, which is smaller than the metal plate 2. An elastic material is desirable for the metal plate 2 and, for example, phosphor bronze, 42Ni, or other suitable material, is preferably used. Moreover, when 42 Ni is used for the metal plate 3, since the thermal expansion coefficient is close to that of the ceramics (PZT, etc.), the reliability is even more increased. The insulating layer 3 can be constructed by using a resin coating such as polyimide resin, epoxy resin, or other suitable material, or by forming an oxide film on the surface of the metal plate by an oxidation treatment.

The piezoelectric body 4 is constructed such that two piezoelectric ceramic layers **4*a* and 4*b* in the state of a green sheet are laminated with an internal electrode 5 therebetween and fired, and external electrodes 6 and 7 are provided on almost the entire area of the top and bottom surfaces of the piezoelectric body 4. The piezoelectric ceramic layers 4*a* and 4*b* are alternately polarized in the thickness direction so as to be opposite to each other as shown by arrow marks P in FIG. 6. One end of the internal electrode 5 is exposed at one end surface of the piezoelectric body 4 and the other end is a fixed distance away from the end surface of the piezoelectric body 4. The top and bottom external electrodes 6 and 7 of the piezoelectric body 4 are connected to each other through one end surface electrode 8, and the internal electrode 5 is connected to lead-out electrodes 10 and 11 disposed on the top and bottom surfaces of the piezoelectric body 4 through the other end surface electrode 9. The lead-out electrodes 10 and 11 are small electrodes arranged along the middle of one side of the piezoelectric body 4 and electrically separated from the external electrodes 6 and 7 on the top and bottom surfaces. One end surface electrode 8 is as long as one side of the piezoelectric body 4, but the other end surface electrode 9 has a length corresponding to the length of the lead-out electrodes 10 and 11. Moreover, in this preferred embodiment, although the lead-out electrodes 10 and 11 are disposed not only on the top surface, but also on the bottom surface to eliminate directional properties, the lead-out electrode 11 on the bottom surface may be omitted. Furthermore, the lead-out electrodes 10 and 11 may be made as long as one side of the piezoelectric body 4. The bottom surface of the piezoelectric body 4 is bonded on the upper middle surface of the insulating layer 3 by using an adhesive 12 such as epoxy adhesive, or other suitable material. (see FIG. 5). The metal plate 2 is larger than the piezoelectric body 4 and the insulating layer 3 is arranged on the surface of the extension portion 2*a* so as to extend outside the piezoelectric body 4**.

The case 20 is constructed to constitute a substantially square-shaped box having a bottom wall and four side walls made of an insulating material such as ceramics, resin, or other suitable material. When the case 20 is formed by using a resin material, a heat-resistant material such as LCP (liquid crystal polymer), SPS (syndiotactic polystylene), PPS (polyphenylene sulfide), epoxy, or other suitable material, is desirable to use. A supporting portion 21 for supporting the entire periphery portion of the sounding body 1A is disposed inside the side wall of the case 20, and internal connection portions **22*a* and 23*a* of terminals 22 and 23 to be electrically connected to the top external electrode 6 and the lead-out electrode 10 of the sounding body 1A are exposed on the inside surfaces of the opposing two side walls. Furthermore, a spacing wall portion 24 is integrally formed in the case 20 so as to be positioned between the supporting portion 21 and the internal connection portions 22***a* and 23*a* of the terminals 22 and 23 (see FIG. 4). When the metal plate 2 is mounted on the supporting portion 21 to be described later, this spacing wall portion 24 functions as a spacer preventing the metal plate 2 from being in contact with the terminals 22 and 23.

Figure 7:
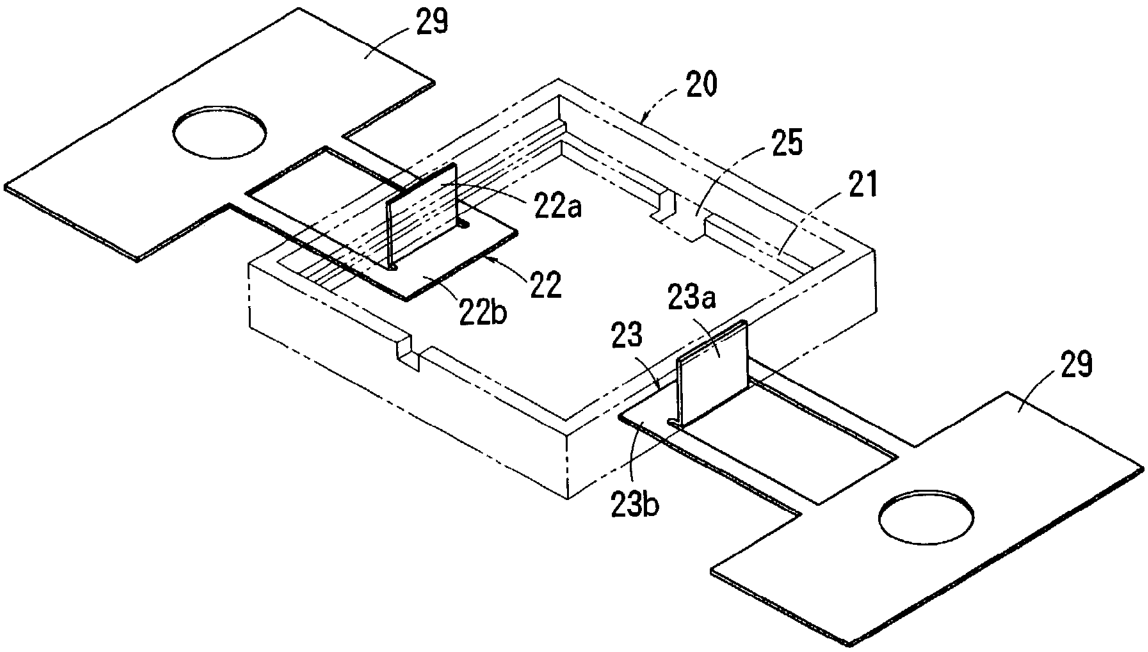
FIG. 7 shows an insert-molded case with terminals.
Figure 8:
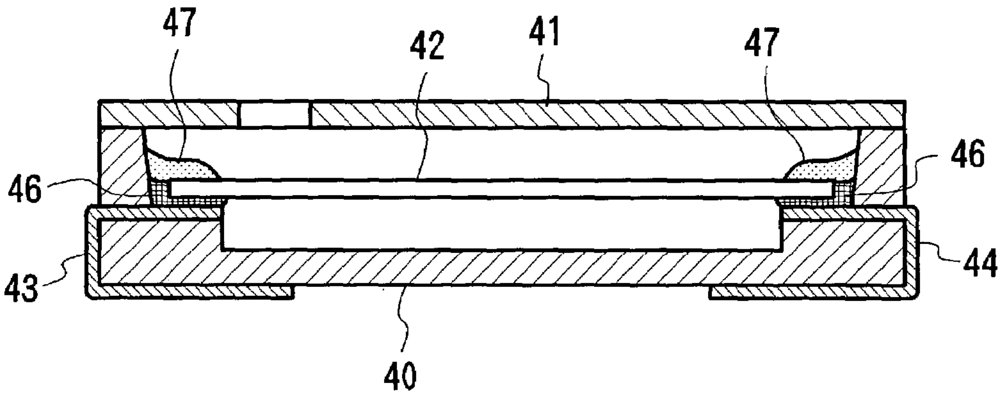
FIG. 8 PRIOR ART
FIG. 8 is a sectional view of one example of a related piezoelectric electroacoustic transducer.

The terminals 22 and 23 are insert molded in the case 20, and, as shown in FIG. 7, the outside portions 22*a* and 23*a* of the terminals 22 and 23, which are integrally punched out from a hoop material 29, are substantially perpendicularly bent and these bent portions are made to be the internal connection portions to the sounding body 1A. The internal connection portions 22*a* and 23*a* are arranged upright relative to the bottom surface of the case (sounding body 1A) and accordingly, the internal connection portions 22*a* and 23*a* are arranged so as not to extend inside the case 20. Thus, the dimensional difference between the dimension L of the case 20 and the dimension S of the piezoelectric sounding body 1 is minimized. As a result, the resonance frequency of the piezoelectric sounding body is reduced and the sounding pressure is greatly increased. The external connection portions 22*b* and 23*b* of the terminals 22 and 23 are extended along the bottom surface of the case 20.

A lower sound release hole 25 is formed in the bottom portion of one of the side walls where the terminals 22 and 23 of the case 20 are not provided and a groove 26 for sound release is provided in the top portion of the other side wall. A cover 30 in the present preferred embodiment is preferably formed by using the same material as the case 20 so as to be flat. The groove 26 becomes an upper sound release hole when the cover 30 is bonded to the top portion of the side walls of the case 20 by using an adhesive 31. Moreover, the cover 30 is not be required to be flat, but may be made cap-shaped, that is, substantially concave in section. Furthermore, the upper sound release hole 26 is not required to be made of the groove provided in the top portion of the side wall of the case 20, and may be formed as a hole provided in the cover 30.

The piezoelectric sounding body 1A is housed in the case 20 such that the metal plate 2 faces the bottom wall and the periphery portion is mounted on the supporting portion 21. Next, an insulation material 32 is coated so as to form a line between the periphery portion of the metal plate 2 and the internal connection portions 22*a* and 23*a* of the terminals 22 and 23 and hardened. Any insulating adhesive may be used as the insulating material 32, but it is desirable to use an elastic adhesive such as urethane, or silicone adhesives. Next, a conductive adhesive 33 is coated between the top external electrode 6 and the internal connection portion 22*a* of the terminal 22 and between the lead-out electrode 10 and the internal connection portion 23*a* of the terminal 23 so as to be substantially perpendicular to the insulating material 32 and hardened. Although the internal connection portions 22*a* and 23*a* of the terminals 22 and 23 are arranged upright, since a wide area is exposed, the area which is conductive to the conductive adhesive 33 is large and the reliability of electrical conduction is high. It is desirable to use an elastic urethane adhesive including conductive fillers therebetween as the conductive adhesive 33. Although the conductive adhesive 33 is coated on the metal plate 2, since the insulating layer 3 is provided on the metal plate in advance and the periphery portion of the metal plate 2 is covered by the insulating material 32, the conductive adhesive 33 is not in direct contact with the metal plate 2. Next, the whole periphery portion of the metal plate 2 is fixed to the case 20 by using an adhesive 34. Any commonly known insulating adhesive may be used as the adhesive 34, but it is desirable to use an elastic adhesive such as urethane, or silicone adhesives. As described above, after the sounding body 1A has been fixed to the case 20, a cover 30 is bonded to the upper opening portion of the case by using the adhesive 31. When the cover 30 is bonded, an acoustic space is defined between the cover 30 and the sounding body 1A and between the sounding body 1A and the case 20 to establish a surface mounting type piezoelectric sounder.

As described above, since an elastic material is used as the adhesives 32, 33, and 34 for fixing the sounding body 1 to the case 20, the displacement of the sounding body 1 can be maximized and accordingly, it becomes possible to obtain a high sound pressure. Furthermore, since the electrodes (the top external electrode 6 and the lead-out electrode 10) of the sounding body 1 are directly connected to the electrodes (the terminals 22 and 23) of the case 20 by using the conductive adhesive 33, the electrical reliability increases compared with the case in which electrical conduction is performed through the metal plate 2. In addition, since the conductive adhesive 33 can be coated from above the case 20 by using a coating device such as a dispenser, the coating can be easily automated and the manufacturing efficiency and the quality can be improved compared with the case where the lead wires are soldered.

When a signal having substantially the same frequency as the resonance frequency of the sounding body 1 is applied between the terminals 22 and 23 provided in the above case 20, the piezoelectric body 4 expands and contracts in the plane direction and, since the metal plate 2 does not expand and contract, bending deformation of the sounding body 1 takes place as a whole. Since the periphery portion of the sounding body 1 is supported by the case 20 and the space on the top and bottom of the sounding body 1 is sealed by the adhesive 34, a fixed sound wave can be generated. This sound wave is released to the outside through the upper sound release hole 26.

Examples of the dimensions of each element in the above-described preferred embodiment are as follows.

Piezoelectric body 4: approximately 6.8 mm×6.8 mm×30 μm (In the case of a two-layer construction, each layer is about 15 μm.)

Metal plate 2: approximately 8.0 mm×8.0 mm×20 μm

Insulating layer 3: approximately 8.0 mm×8.0 mm×3 μm

Case 20 approximately 9.0 mm×9.0 mm×2.6 mm

Figure 9:
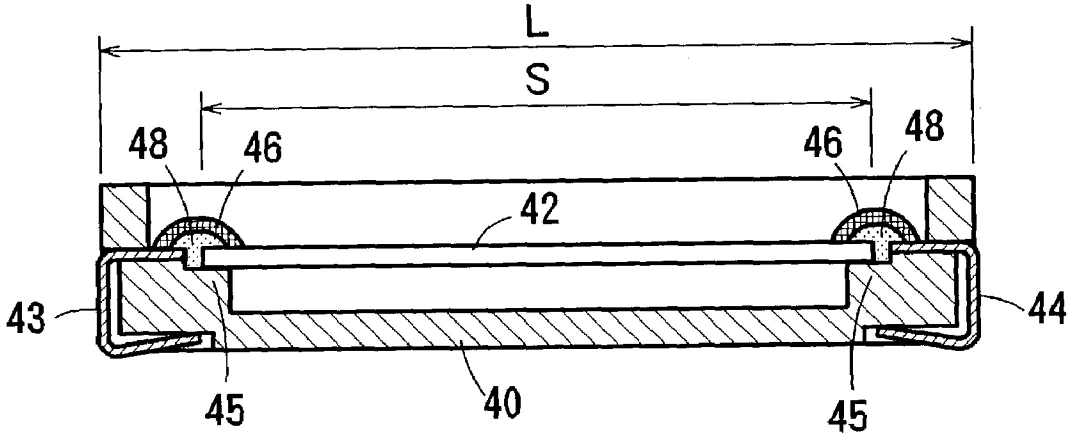
FIG. 9 PRIOR ART
FIG. 9 is a sectional view of another example of a related piezoelectric electroacoustic transducer.

As described above, since the internal connection portions 22*a* and 23*a* of the terminals 22 and 23 are exposed on the inside surface of the side wall of the case 10 and are substantially perpendicular to the bottom surface (sounding body 1), the internal connection portions 22*a* and 23*a* do not largely extend inside the case 10 and the dimension S of the piezoelectric sounding body 1 can be made as close to the dimension L of the case as possible. In the case of a related construction as shown in FIG. 9, although the ratio of S to L is about 85% at best, the ratio of S to L can be made about 90% in the construction of the present preferred embodiment. As a result, even if the dimension L of the case is the same, since the dimension S of the piezoelectric sounding body 1 can be increased, the resonance frequency can be reduced compared with the case of a related construction and the sound pressure can be increased.

The present invention is not limited to the above-described preferred embodiments. The piezoelectric body is not limited to a two-layer construction, but may be constructed of three or more layers or of a single layer. Furthermore, the metal plate and the piezoelectric body are not limited to a substantially square shape, but also may have a substantially rectangular or substantially round shape. The metal plate is not necessarily required to be larger than the piezoelectric body and may have the same shape as the piezoelectric body. A piezoelectric body of the present invention is not limited to a unimorph construction where a piezoelectric body is bonded to a metal plate, but also a piezoelectric sounding body may be of a bimorph construction, that is, of a laminated piezoelectric ceramic as described in Japanese Unexamined Patent Application Publication No. 2001-95094. Although the supporting portion for supporting the four sides of a piezoelectric sounding body is provided inside a case constituting an enclosure, the supporting portion may be provided at two sides where the terminals are exposed or at four corner portions and the area having no supporting portion may be only sealed by using an elastic sealing material. In the above-described preferred embodiments, although a partition wall 24 is provided inside the side wall of the case 20, the partition wall 24 is arranged to prevent the metal plate 2 from being in contact with the terminals 22 and 23. If the electrodes are disposed at the end portion in a piezoelectric sounding body, the partition wall 24 may be omitted. For the same reason, the insulating material 32 to be coated on the periphery portion of the metal plate 2 can be omitted. In the above-described preferred embodiments, although the enclosure includes a concave case and a cover for closing the opening portion, the enclosure is not limited to such a construction. The present invention can be applied not only to sounding parts used in the same resonance area as in the piezoelectric sounder, but also to sounding parts that are able to cope with a wide range of frequencies as in the piezoelectric receiver. Furthermore, in preferred embodiments of the present invention, an alternating signal includes not only an AC signal, but also a square wave signal.

As is clearly understood from the above description, according to a preferred embodiment of the present invention, since the internal connection portion of an insert-molded terminal in an enclosure is exposed in the direction that is substantially perpendicular to the inside surface of the side wall of the enclosure and the internal connection portion of the terminal is connected to the electrode of the piezoelectric sounding body by using conductive adhesive, the internal connection portion of the terminal does not largely extend inside the case and accordingly, the dimensional difference between the case and the piezoelectric sounding body can be reduced. Therefore, the dimension of the piezoelectric sounding body can be relatively increased, the resonance frequency of the piezoelectric sounding body is reduced, and the sound pressure can be increased. Furthermore, although the terminal exposed in the substantially perpendicular direction is electrically connected to the electrode of the piezoelectric sounding body by conductive adhesive, the contacting area between the conductive adhesive and the exposed portion of the terminal can be assured and accordingly, the reliable electrical conductivity can be realized.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. A piezoelectric electroacoustic transducer comprising:

a piezoelectric sounding body having two electrodes and in which, when an alternating signal is applied between the two electrodes, bending vibration is generated;

an enclosure housing the piezoelectric sounding body; and a pair of terminals insert-molded in the enclosure;

wherein internal connection portions of the pair of terminals are exposed on an inside surface of a side wall of the enclosure so as to extend in a direction that is substantially perpendicular to the piezoelectric sounding body; and the internal connection portions of the terminals are electrically connected to the electrodes of the piezoelectric sounding body by conductive adhesive.

2. A piezoelectric electroacoustic transducer as claimed in claim 1, wherein the piezoelectric sounding body is substantially square-shaped.

3. A piezoelectric electroacoustic transducer as claimed in claim 1, wherein the pair of terminals are exposed on the inner surface of the opposing two side walls of the enclosure.

4. A piezoelectric electroacoustic transducer as claimed in claim 1, wherein a supporting portion for supporting the four sides of the piezoelectric sounding body is provided inside the side wall of the enclosure.

5. A piezoelectric electroacoustic transducer as claimed in claim 4, wherein a spacing wall portion is integrally provided in the enclosure so as to be positioned between the supporting portion and the internal connection portions of the terminals.

6. A piezoelectric electroacoustic transducer as claimed in claim 5, wherein the piezoelectric sounding body includes a substantially square metal plate, an insulating layer disposed on a surface of the metal plate, and a substantially square piezoelectric body fixed on the insulating layer, the metal plate is mounted on the supporting portion such that the spacing wall portion functions as a spacer preventing the metal plate from being in contact with the terminals.

7. A piezoelectric electroacoustic transducer as claimed in claim 1, wherein, in the state where the piezoelectric sounding body is mounted on the supporting portion, the electrodes of the piezoelectric body are electrically connected to the internal connection portions by the conductive adhesive coated therebetween.

8. A piezoelectric electroacoustic transducer as claimed in claim 1, wherein the periphery portion of the piezoelectric sounding body is fixed to the enclosure by the adhesive coated therebetween.

9. A piezoelectric electroacoustic transducer as claimed in claim 1, wherein the terminals are substantially L-shaped in section.

10. A piezoelectric electroacoustic transducer as claimed in claim 1, wherein an upright portion of the terminals constitutes the internal connection portions.

11. A piezoelectric electroacoustic transducer as claimed in claim 1, wherein portions of the terminals extending along the bottom surface of the enclosure constitute external connection portions.

12. A piezoelectric electroacoustic transducer as claimed in claim 1, wherein the piezoelectric sounding body is a unimorph-type piezoelectric sounding body.

13. A piezoelectric electroacoustic transducer as claimed in claim 1, wherein the piezoelectric sounding body includes a substantially square metal plate, an insulating layer disposed on a surface of the metal plate, and a substantially square piezoelectric body fixed on the insulating layer.

14. A piezoelectric electroacoustic transducer as claimed in claim 13, wherein the substantially square piezoelectric body is fixed on the insulating layer via an adhesive having an area that is smaller than the metal plate.

15. A piezoelectric electroacoustic transducer as claimed in claim 13, wherein the metal plate is larger than the piezoelectric body.

16. A piezoelectric electroacoustic transducer as claimed in claim 13, wherein the insulating layer is arranged on a surface of an extension portion so as to extend outside the piezoelectric body.

17. A piezoelectric electroacoustic transducer as claimed in claim 1, wherein a lower sound release hole is provided in a bottom portion of a side wall of the enclosure where the terminals of the case are not provided.

18. A piezoelectric electroacoustic transducer as claimed in claim 1, wherein a groove for sound release is provided in a top portion of a side wall of the enclosure.

19. A piezoelectric electroacoustic transducer as claimed in claim 1, wherein an acoustic space is defined between the enclosure and the sounding body above the sounding body.

20. A piezoelectric electroacoustic transducer as claimed in claim 1, wherein an acoustic space is defined between the enclosure and the sounding body below the sounding body.

* * * * *